(12) United States Patent
Cho

(10) Patent No.: US 11,149,752 B2
(45) Date of Patent: Oct. 19, 2021

(54) VACUUM PUMP USING PROFILE

(71) Applicant: VTEC CO., LTD, Busan (KR)

(72) Inventor: Ho-Young Cho, Seoul (KR)

(73) Assignee: VTEC CO., LTD, Busan (KR)

( * ) Notice: Subject to any disclaimer, the term of this patent is extended or adjusted under 35 U.S.C. 154(b) by 164 days.

(21) Appl. No.: 16/330,741

(22) PCT Filed: Jul. 3, 2017

(86) PCT No.: PCT/KR2017/007006
§ 371 (c)(1),
(2) Date: Mar. 5, 2019

(87) PCT Pub. No.: WO2018/056558
PCT Pub. Date: Mar. 29, 2018

(65) Prior Publication Data
US 2019/0203738 A1     Jul. 4, 2019

(30) Foreign Application Priority Data
Sep. 21, 2016 (KR) .................. 10-2016-0120525

(51) Int. Cl.
*F04F 5/20* (2006.01)
*H01L 21/683* (2006.01)
(Continued)

(52) U.S. Cl.
CPC .................. *F04F 5/20* (2013.01); *F04F 5/14* (2013.01); *F04F 5/22* (2013.01); *H01L 21/6838* (2013.01)

(58) Field of Classification Search
CPC ....... F04F 5/20; F04F 5/22; F04F 5/14; H01L 21/6838
See application file for complete search history.

(56) References Cited

U.S. PATENT DOCUMENTS 4,395,202 A   7/1983   Tell
4,565,499 A   1/1986   Greenburg
(Continued)

FOREIGN PATENT DOCUMENTS

KR   10-0890191 B1   3/2009
KR   10-1157542 B1   6/2012
(Continued)

*Primary Examiner* — Charles G Freay
(74) *Attorney, Agent, or Firm* — Culhane Meadows PLLC; Robert C. Klinger

(57) ABSTRACT

The present invention relates to a vacuum pump using a profile. The vacuum pump according to the present invention comprises: a hollow profile having a longitudinal mounting hole and a vacuum chamber formed adjacent to each other; an ejector pump arranged inside the mounting hole in the longitudinal direction; and end caps provided in both openings of the profile, respectively, so as to have a through-hole formed therein so as to correspond to the inflow opening or the discharge opening. Particularly, the first cap near the inflow opening is designed to have a passage through which the vacuum chamber and the mounting hole communicate with each other. The vacuum pump structure according to the present invention is considered to be a vacuum pump structure using at least a so-called "profile" best designed to make fabrication of the vacuum pump convenient and to improve vacuum characteristics.

7 Claims, 4 Drawing Sheets

(51) Int. Cl.
*F04F 5/22* (2006.01)
*F04F 5/14* (2006.01)

(56) References Cited

U.S. PATENT DOCUMENTS

| | | | |
|---|---|---|---|
| 4,759,691 A | 7/1988 | Kroupa | |
| 4,790,054 A | 12/1988 | Nichols | |
| 4,880,358 A | 11/1989 | Lasto | |
| 4,960,364 A | 10/1990 | Tell | |
| 5,228,839 A | 7/1993 | Peterson | |
| 5,683,227 A * | 11/1997 | Nagai | F04F 5/22 |
| | | | 417/174 |
| 6,171,068 B1 * | 1/2001 | Greenberg | F04F 5/22 |
| | | | 417/174 |
| 6,393,760 B1 | 5/2002 | Tell | |
| 6,682,313 B1 * | 1/2004 | Sulmone | F04D 9/06 |
| | | | 417/199.2 |
| 7,452,191 B2 | 11/2008 | Tell | |
| 8,231,358 B2 | 7/2012 | Cho | |
| 8,257,456 B2 | 9/2012 | Cho | |
| 8,561,972 B2 | 10/2013 | Neville | |
| 8,596,990 B2 | 12/2013 | Schaaf | |
| 8,672,644 B2 | 3/2014 | Kidd et al. | |
| 2015/0308461 A1 | 10/2015 | Tell | |
| 2015/0354600 A1 * | 12/2015 | Fletcher | F04F 5/14 |
| | | | 417/179 |
| 2019/0143536 A1 * | 5/2019 | Tell | F04F 5/52 |
| | | | 294/64.3 |
| 2019/0168153 A1 * | 6/2019 | Cho | F04F 5/54 |

FOREIGN PATENT DOCUMENTS

| | | |
|---|---|---|
| KR | 10-1251825 B1 | 4/2013 |
| KR | 10-2014-0000264 A | 1/2014 |
| KR | 10-1351768 B1 | 1/2014 |
| KR | 10-1472503 B1 | 12/2014 |

\* cited by examiner

[FIG. 1]
Prior Art
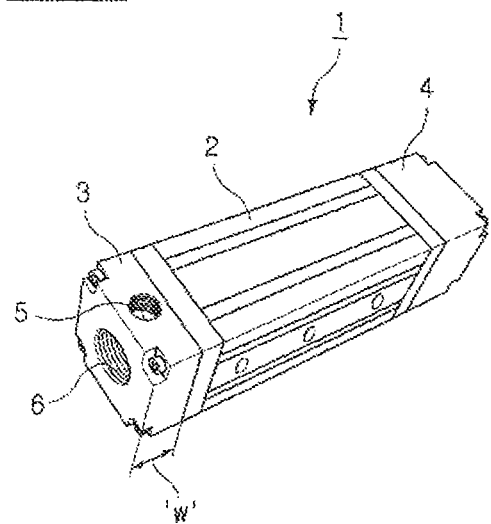
[FIG. 2]
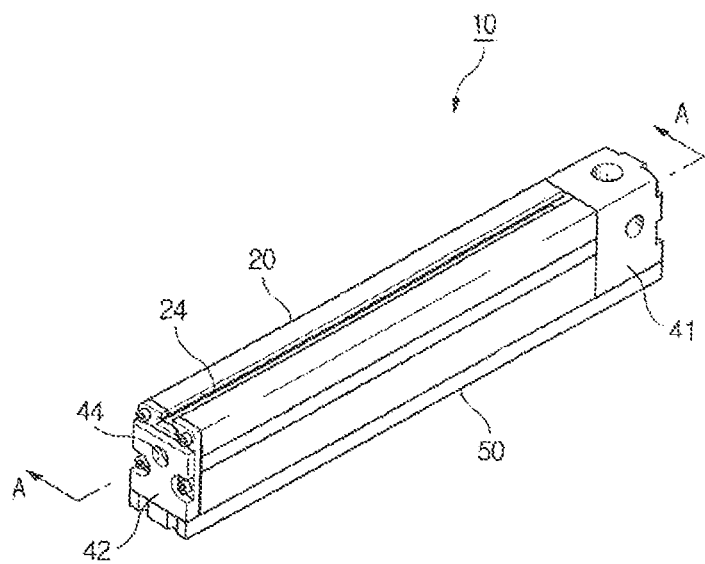

[FIG. 3]
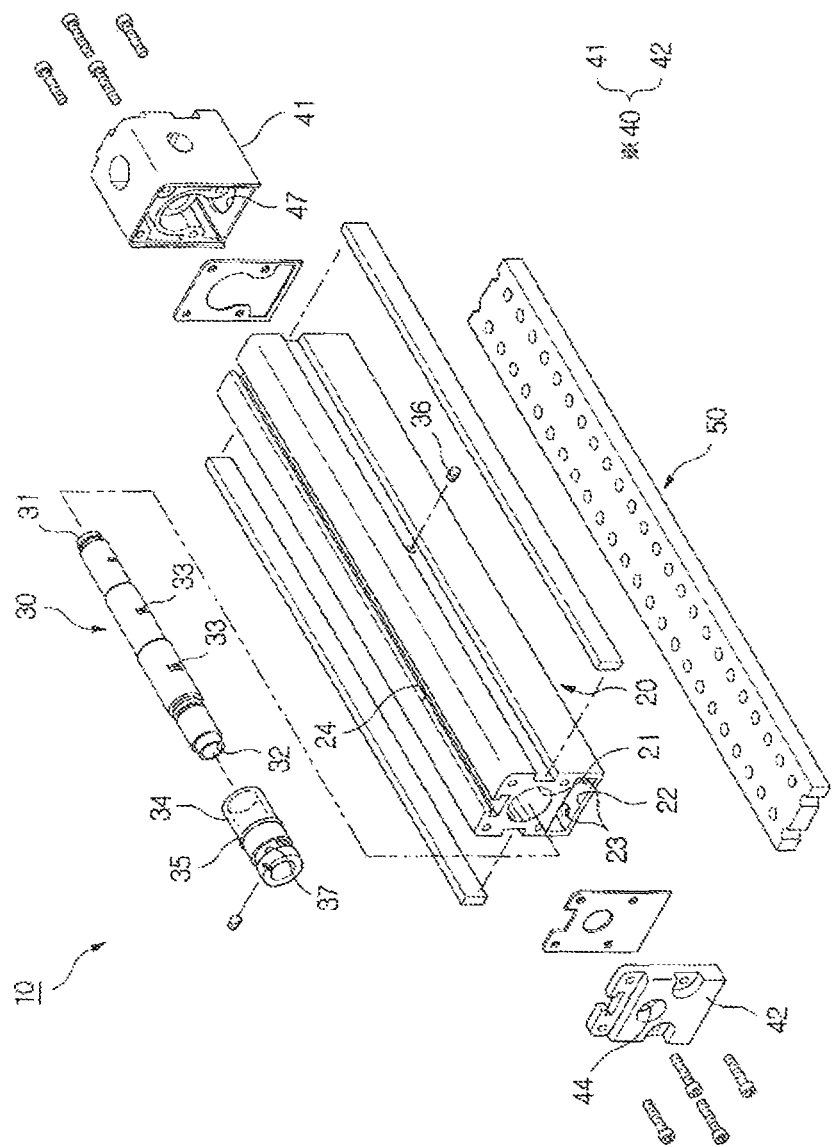
[Fig.4]
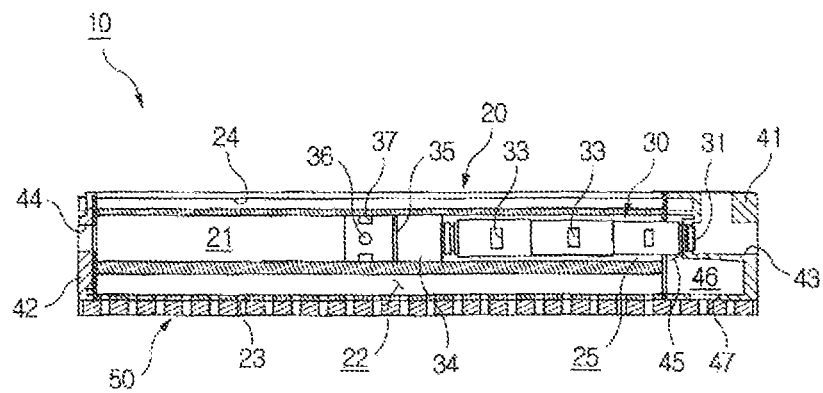

[FIG. 5]
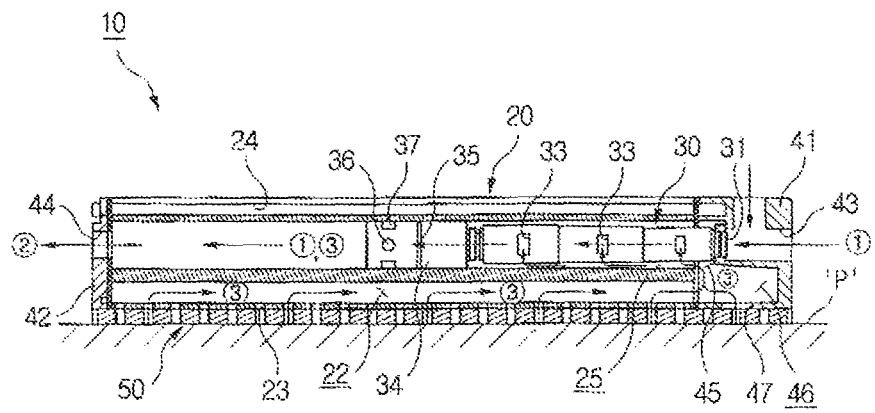
[FIG. 6]
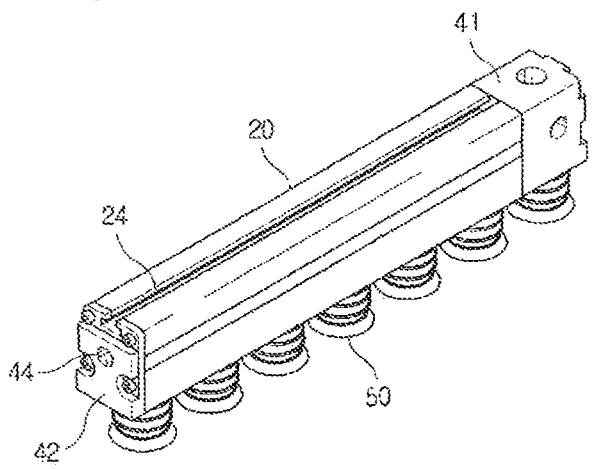

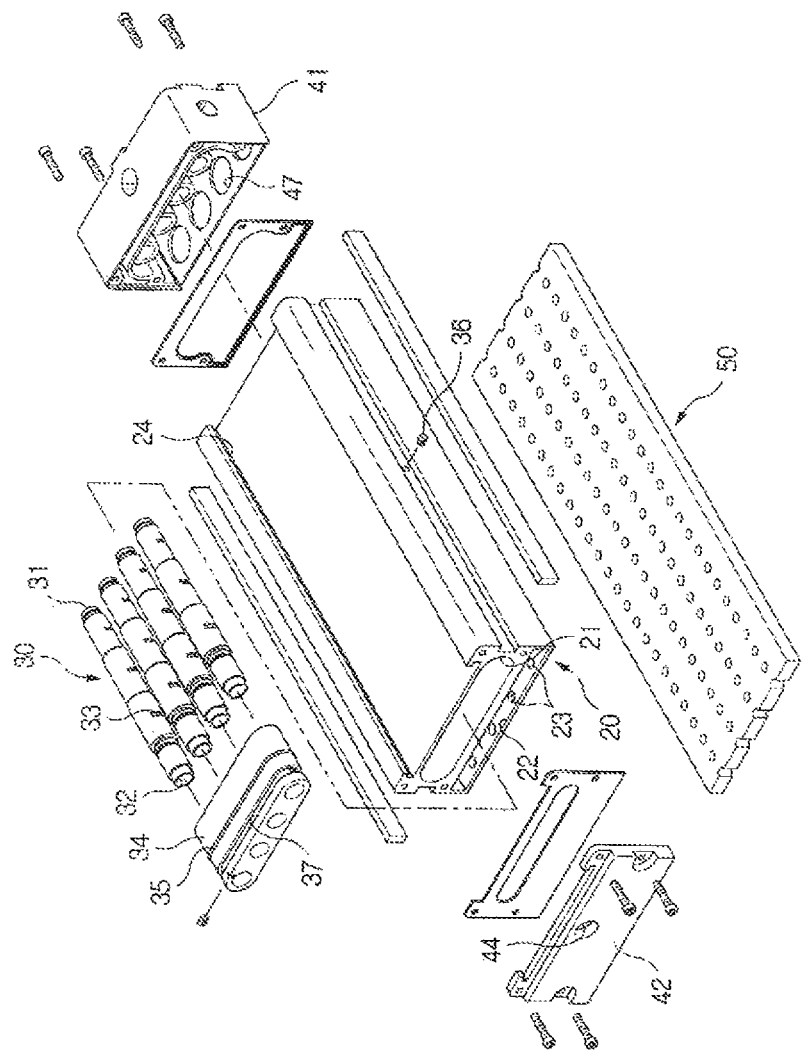
[FIG. 7]

VACUUM PUMP USING PROFILE

TECHNICAL FIELD

The present invention relates generally to a vacuum pump and, more particularly, to a vacuum pump that is mainly applied to a vacuum transfer system and generates vacuum and negative pressure in a predetermined space by exhaust performed by compressed air passing at high speed.

BACKGROUND ART

A vacuum system generally includes a compressed air supply device, a vacuum pump with an ejector mounted therein, and a suction pad connected to the vacuum pump, wherein when compressed air supplied from the supply device passes through the vacuum pump at high speed, vacuum and negative pressure are formed as the internal spaces of the vacuum pump and the suction pad are exhausted, and it is possible to hold and transport an object by the generated negative pressure.

Traditionally, since the vacuum pump is a box-type pump in terms of appearance, it has the advantage of providing stability in the system configuration, but it is difficult to mount the vacuum pump directly in a housing that provides, for example, a surrounding space, so the applicability thereof is very limited. Thus, what has been developed is a so-called rotationally symmetric or cylindrical-type ejector pump.

These types of ejector pumps are disclosed in the documents of Korean Patent No. 393434, No. 578540, No. 629994, and the like. The disclosed pumps are rotationally symmetric or cylindrical-types in terms of appearance, and are configured such that nozzles arranged in series are mounted therein, and a through-hole is formed in a wall thereof to communicate with the outside. The pump configured as described above is advantageous in that it can be directly mounted to various types of housings that provide the surrounding space, and one of the housing elements is a profile.

FIG. 1 shows a profile-type vacuum pump 1 disclosed in Korean Patent No. 1351768. Herein, a profile 2 is a hollow extruded member hollow in the longitudinal direction, and is configured such that an ejector pump is accommodated therein, and opposite ends of the profile are provided with closing members 3 and 4 formed with a compressed air inlet 5 and an outlet, respectively. Further, a suction pad is connected to a suction port 6 formed in the closing member 3 or in a side wall of the profile 2 through a hose. In the vacuum pump 1 configured as described above, when high speed compressed air passes through the inlet 5 and the outlet, the inside of the suction pad connected to the suction port 6 is exhausted.

The profile is advantageous in that since it is a hollow extruded member hollow in the longitudinal direction, it can be used as a housing of the vacuum pump 1 by cutting it to an appropriate length.

However, the vacuum pump 1 has the following problems.

As the suction port 6 is directly connected to the ejector pump side, the vacuum speed and vacuum degree that can be implemented in the vacuum pump 1 is not high.

Particularly, although having a considerable width w, the closing member 3 on the inlet 5 side is not efficiently utilized in terms of the characteristics of the vacuum pump 1.

DISCLOSURE

Technical Problem

Accordingly, the present invention has been made keeping in mind the above problems occurring in the prior art, and an object of the present invention is to provide a vacuum pump using a profile, particularly, a vacuum pump capable of improving the vacuum characteristics of the pump through a special design of a closing member on an air inlet side.

Technical Solution

The vacuum pump of the present invention includes:

a hollow profile provided with amounting hole at an upper portion thereof and a vacuum chamber at a lower portion thereof being in parallel to each other in a longitudinal direction to be adjacent to each other, with a side of the vacuum chamber formed with a plurality of communication holes communicating with a suction means;

at least one ejector pump being a cylindrical-type pump configured such that a first end thereof is a compressed air inlet, a second end thereof is a compressed air outlet, and at least one through-hole is formed in a side wall thereof, and being disposed in the mounting hole in the longitudinal direction and fixed thereto; and end caps being provided in opposite openings of the profile, respectively, including a first cap and a second cap formed with through-holes corresponding to the inlet or the outlet, with the first cap on an inlet side designed to have a passage communicating the vacuum chamber and the mounting hole with each other.

Preferably, the first cap includes an auxiliary chamber formed at a lower portion thereof to be spatially connected with the vacuum chamber, and the passage is formed at a side of the auxiliary chamber. In this case, the auxiliary chamber may be formed in a surface thereof with a communication hole communicating with the suction means.

Preferably, the suction means is a pad-type means attached to the surfaces of the vacuum chamber and the auxiliary chamber with the communication holes formed in the surfaces, or is a cup-type means mounted or connected to the communication holes.

Advantageous Effects

The vacuum pump according to the present invention is configured such that a hollow profile includes a mounting hole and a vacuum chamber formed in parallel to each other in a longitudinal direction, and the mounting hole and the vacuum chamber communicate with each other at a first cap. Accordingly, fabrication of the profile and the vacuum pump is easy and simple. Meanwhile, when operating the vacuum pump, vacuum characteristics such as vacuum speed, vacuum degree, and vacuum retention are improved.

In a preferred embodiment, the first cap includes an auxiliary chamber connected with the vacuum chamber, and the bottom surface of the auxiliary chamber is formed with a communication hole communicating with a suction means. Accordingly, while the first cap itself enhances the vacuum characteristics of the pump, a wider or more suction means can be used in the vacuum pump of the present invention.

DESCRIPTION OF DRAWINGS

FIG. 1 is a view illustrating a conventional vacuum pump;

FIG. 2 is a perspective view illustrating a vacuum pump according to an embodiment of the present invention;

FIG. 3 is an exploded perspective view of FIG. 2;

FIG. 4 is a sectional view taken along line A-A of FIG. 2;

FIG. 5 is a view illustrating an operation of the vacuum pump of FIG. 2;

FIG. 6 is a perspective view illustrating a Vacuum pump according to another embodiment of the present invention; and FIG. 7 is an exploded perspective view illustrating a vacuum pump according to a further embodiment of the present invention.

DESCRIPTION OF REFERENCE CHARACTERS OF IMPORTANT PARTS 10. vacuum pump
20. profile
21. mounting hole 22. vacuum chamber
23. communication hole 24. T-shaped groove
25. surrounding space
30. ejector pump
31. inlet 32. outlet
33. through-hole 34. fixing portion
35. sealing ring 36. fixing bolt
37. annular groove
40. end caps
41. first cap 42. second cap
43, 44. through-hole 45. passage
46. auxiliary chamber 47. communication hole
50. suction means
'P'. object

BEST MODE

Detailed features and advantages of a vacuum pump using a profile (hereinafter, referred to as a vacuum pump) of the present invention will be apparent from the following detailed description based on the accompanying drawings. The vacuum pump according to the present invention is designated by reference numeral 10 in FIGS. 2 to 7.

Referring to FIGS. 2 to 4, a vacuum pump 10 according to the present invention includes: a hollow profile 20 providing a housing; an ejector pump 30 accommodated in the profile 20 in the longitudinal direction; and end caps 40 for finishing opposite opening portions of the profile 20.

The profile 20 is an aluminum extrusion Member in which a mounting hole 21 at an upper portion thereof and a vacuum chamber 22 at a lower portion thereof are formed in parallel to each other in the longitudinal direction to be adjacent to each other. As will be described later, in the present invention, the mounting hole 21 and the vacuum chamber 22 are connected by the end cap 40 structure. Accordingly, in the embodiment, the mounting hole 21 and the vacuum chamber 22 may exist as separate elements that do not communicate with each other in the profile 20 itself.

The vacuum chamber 22 is formed in the bottom surface thereof with a plurality of communication holes 23 communicating with a suction means 50. The communication holes 23 may be different in shape, size and arrangement depending on the type of suction means 50 applied. In the embodiment, the suction means 50 is a sponge or pad-type means attached to the bottom surface of the vacuum chamber 22. However, the present invention is not limited to the above described suction means 50 but may be a cup-type means as illustrated in FIG. 6 and directly mounted to the communication holes 23 or indirectly mounted through lines.

The profile 20, of course, has the advantage that it can be cut to an appropriate length and used if necessary. Meanwhile, the upper surface of the profile is formed with a T-shaped groove 24 in the longitudinal direction, such that the vacuum pump 10 of the present invention can be easily mounted to a robotic means of the vacuum transfer system.

The ejector pump 30 is a conventional ejector pump configured such that opposite ends thereof are compressed air inlet 31 and a compressed air outlet 32, respectively, an air nozzle is mounted therein, and at least one through-hole 33 is formed in a side wall thereof. The through-hole 33 allows the outside air of the vacuum pump 10 to be sucked into the ejector pump 30. Preferably, the ejector pump 30 is a so-called cylindrical-type ejector pump having a rotationally symmetrical outer shape, and being configured such that a plurality of nozzles arranged in series is mounted therein and the through-hole 33 communicating with the outside is formed in the wall.

Depending on the required capacity of the vacuum pump 10, the number of ejector pumps 30 accommodated in the mounting hole 21 may be one or more. As shown in FIG. 7, when two or more ejector pumps 30 are provided, the ejector pumps 30 are arranged in parallel to each other.

The ejector pump 30 is placed in the mounting hole 21 in the longitudinal direction. For fixing the ejector pump, the ejector pump 30 further includes a ring-shaped fixing portion 34 formed at an outlet 32 side end thereof. The ejector pump 30 is configured such that the end portion on the inlet 31 side is inserted into a through-hole 43 of the end cap 41, and the outlet 32 side end is inserted into the fixing portion 34; and the outer circumferential surface of the fixing portion 34 is brought into close contact with the inner surface of the mounting hole 21.

By the fixing portion 34, the ejector pump 30 is fitted in the mounting hole 21, and here, a surrounding space 25 surrounding the ejector pump 30 is formed in a part of the mounting hole 21. In the embodiment, the fixing portion 34 is provided separately from the ejector pump 30, but in other embodiments not shown, the fixing portion 34 may be integrally formed in the ejector pump 30 on the outlet 32 side. Reference numeral 35 denotes a sealing ring fitted over the outer circumferential surface of the fixing portion 34 and pressed against the inner surface of the mounting hole 21.

A fixing bolt 36 is provided as an additional fixing means, and the bolt 36 is passed through a side wall of the profile 20 such that an end thereof is inserted in an annular groove 37 formed on the outer circumferential surface of the fixing portion 34. Thereby, the fixing portion 34 is prevented from being moved.

The end caps 40 include a first cap 41 and a second cap 42 provided in opposite openings of the profile 20, respectively, and each cap 41, 42 is formed with a through-hole 43, 44 corresponding to the inlet 31 or the outlet 32 of the ejector pump 30. In practice, each of the caps 41, 42 may be configured to be a molded article made of aluminum or plastic or an assembly of the molded article.

In the present invention, the first cap 41 on the inlet 31 side is designed to have a passage 45 communicating the vacuum chamber 22 on the lower side with the mounting hole 21 on the upper side, in particular with the surrounding spade 25. Accordingly, within the profile 20, the mounting hole 21 and the vacuum chamber 22 can exist as separate parts that do not directly communicate with each other, and at least in a vacuum pump structure using a so-called profile, this is considered to be the best design for improving the vacuum characteristics of the vacuum pump 10 while facilitating the fabrication of the profile 20 and the vacuum pump 10.

Specifically, the first cap 41 includes an auxiliary chamber 46 formed at the lower portion thereof to be spatially connected with the vacuum chamber 22, and the passage 45 is formed at one side of the auxiliary chamber 46. In this case, the auxiliary chamber 46 may be formed in the bottom surface thereof with one or multiple communication holes 47 communicating with the suction means 50. In other words, the embodiment can spatially expand the vacuum chamber 22 using the first cap 41, and thus, a wider or more suction means 50 can be effectively applied to the vacuum pump 10.

Referring to FIG. 5, with a suction object P in contact with the bottom surface of the suction means 50, high speed compressed air is supplied to the inlet 31 of the ejector pump 30 through the through-hole 43 of the first cap 41 (see arrow ①), and this air continues to pass through the ejector pump 30 and the outlet 32, and then is discharged to the outside through the through-hole 44 of the second cap 42 (see arrow ②).

In this process, a pressure drop occurs in the passage 45 between each chamber 22, 46 and the surrounding space 25, whereby the vacuum chamber 22, the auxiliary chamber 46, and the suction means 50 can be exhausted. Specifically, the air inside the suction means 50 passes through the vacuum chamber 22 and the auxiliary chamber 46, flows to the surrounding space 25 via the passage 45, is continuously introduced into the ejector pump 30 through the through-hole 33 of the ejector pump 30 (see arrow ③), and then is discharged to the outside together with the high-speed compressed air (see arrow ②).

Then, vacuum and negative pressure are generated inside each chamber 22, 46 and the surrounding space 25, and the object P is sucked to the vacuum pump 10 by the generated negative pressure. Although not shown, the vacuum pump 10 may be connected to a robotic means to be moved along an automated path, thereby enabling proper transfer of the object P.

The invention claimed is:

1. A vacuum pump using a profile, the vacuum pump comprising:
a hollow extruded profile (20) provided with a mounting hole (21) at an upper portion of the profile and a vacuum chamber (22) at a lower portion of the profile being in parallel to each other in a longitudinal axes direction of the profile to be adjacent to each other, with a side of the vacuum chamber formed with a plurality of communication holes (23) communicating with a suction means (50);
at least one ejector pump (30) being a cylindrical-type pump configured such that a first end thereof is a compressed air inlet (31), a second end thereof is a compressed air outlet (32), and at least one through-hole (33) is formed in a side wall thereof, and being disposed in the mounting hole (21) in the longitudinal axes direction and fixed thereto; and
end caps (40) being provided to cover opposite openings of the profile, respectively, including a first cap (41) and a second cap (42) formed with through-holes (43 and 44) corresponding to the compressed air inlet or the compressed air outlet, with the first cap (41) on an inlet side having an inner passage (45) communicating the vacuum chamber (22) and the mounting hole (21) with each other,
wherein the mounting hole (21) and the vacuum chamber (22) do not communicate directly with each other, and all air communicated to the mounting hole from the vacuum chamber occurs through the inner passage (45) of the first cap (41).

2. The vacuum pump of claim 1, wherein the first cap (41) includes an auxiliary chamber (46) formed at a lower portion of the first cap to be connected with the vacuum chamber (22), and the inner passage (45) is formed at a side of the auxiliary chamber (46).

3. The vacuum pump of claim 2, wherein the auxiliary chamber (46) is formed in a surface thereof with a communication hole (47) communicating with the suction means (50).

4. The vacuum pump of claim 3, wherein the suction means (50) is a pad-type means attached to surfaces of the vacuum chamber (22) and the auxiliary chamber (46) with the communication holes (23 and 47) formed in the surfaces, or is a cup-type means mounted or connected to the communication holes (23 and 47).

5. The vacuum pump of claim 1, wherein the ejector pump (30) includes a ring-shaped fixing portion (34) provided at an outlet (32) side end thereof, and the fixing portion (34) is configured such that an outer circumferential surface thereof is brought into close contact with an inner surface of the mounting hole (21).

6. The vacuum pump of claim 5, wherein a surrounding space (25) surrounding the ejector pump (30) is formed in a part of the mounting hole (21) by the fixing portion (34), and the inner passage (45) communicates the vacuum chamber (22) and the surrounding space (25) with each other.

7. The vacuum pump of claim 5, wherein the fixing portion (34) includes a groove (37) formed on the outer circumferential surface thereof, and a fixing bolt (36) is passed through a side wall of the profile (20) such that an end thereof is inserted in the groove (37).

* * * * *